(12) United States Patent
Ahn et al.

(10) Patent No.: US 10,014,172 B2
(45) Date of Patent: Jul. 3, 2018

(54) THIN FILM TRANSISTOR, THIN FILM TRANSISTOR SUBSTRATE, DISPLAY APPARATUS AND METHOD OF MANUFACTURING THIN FILM TRANSISTOR

(71) Applicant: SAMSUNG DISPLAY CO., LTD., Yongin, Gyeonggi-Do (KR)

(72) Inventors: Byung-Du Ahn, Yongin (KR); Tae-Young Kim, Yongin (KR); Yeon-Gon Mo, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 186 days.

(21) Appl. No.: 14/478,273

(22) Filed: Sep. 5, 2014

(65) Prior Publication Data
US 2015/0255278 A1    Sep. 10, 2015

(30) Foreign Application Priority Data
Mar. 6, 2014   (KR) .......................... 10-2014-0026808

(51) Int. Cl.
*H01L 21/02*   (2006.01)
*G02F 1/1368*   (2006.01)
(Continued)

(52) U.S. Cl.
CPC ...... *H01L 21/02472* (2013.01); *G02F 1/1368* (2013.01); *H01L 21/02441* (2013.01);
(Continued)

(58) Field of Classification Search
None
See application file for complete search history.

(56) References Cited

U.S. PATENT DOCUMENTS

| 8,378,351 B2 | 2/2013 | Fukumoto et al. |
| 2002/0000555 A1* | 1/2002 | Fujikawa .............. H01L 29/458 |
| | | 257/59 |

(Continued)

FOREIGN PATENT DOCUMENTS

| KR | 10-2000-0003178 A | 1/2000 |
| KR | 10-2010-0100603 A | 9/2010 |

(Continued)

*Primary Examiner* — Fernando L Toledo
*Assistant Examiner* — Lawrence-Linh T Nguyen
(74) *Attorney, Agent, or Firm* — Lee & Morse P.C.

(57) ABSTRACT

A thin film transistor including a gate electrode; an active layer insulated from the gate electrode; a source electrode and a drain electrode that are insulated from the gate electrode and are electrically connected to the active layer; a first etch stopper layer that is formed of an insulation material and contacts a portion of the active layer located between areas of the active layer that are electrically connected to the source electrode and the drain electrode; a second etch stopper layer on the first etch stopper layer, the second etch stopper layer being formed of an insulation material of a same type as the insulation material used to form the first etch stopper layer, the second etch stopper layer having a higher density than the first etch stopper layer; and a third etch stopper layer on the second etch stopper layer.

20 Claims, 4 Drawing Sheets

(51) Int. Cl.
*H01L 29/66* (2006.01)
*H01L 29/786* (2006.01)
*H01L 27/12* (2006.01)
*H01L 27/32* (2006.01)

(52) U.S. Cl.
CPC ...... *H01L 27/1225* (2013.01); *H01L 27/1248* (2013.01); *H01L 29/66969* (2013.01); *H01L 29/7869* (2013.01); *H01L 29/78606* (2013.01); *H01L 27/3248* (2013.01)

(56) References Cited

U.S. PATENT DOCUMENTS

| | | | |
|---|---|---|---|
| 2006/0079034 A1 | 4/2006 | Hoffman et al. | |
| 2010/0090217 A1 | 4/2010 | Akimoto | |
| 2010/0224871 A1* | 9/2010 | Yamaguchi | H01L 29/7869 257/43 |
| 2010/0297474 A1* | 11/2010 | Dameron | C23C 16/04 428/702 |
| 2011/0269266 A1* | 11/2011 | Yamazaki | H01L 21/02554 438/104 |
| 2013/0134514 A1* | 5/2013 | Chang | H01L 29/78606 257/347 |
| 2013/0134541 A1* | 5/2013 | Chang | H01L 27/1462 257/435 |
| 2013/0240878 A1 | 9/2013 | Morosawa et al. | |

FOREIGN PATENT DOCUMENTS

| | | |
|---|---|---|
| KR | 10-2011-0069042 A | 6/2011 |
| KR | 10-2013-0099693 A | 9/2013 |

\* cited by examiner

THIN FILM TRANSISTOR, THIN FILM TRANSISTOR SUBSTRATE, DISPLAY APPARATUS AND METHOD OF MANUFACTURING THIN FILM TRANSISTOR

CROSS-REFERENCE TO RELATED APPLICATION

Korean Patent Application No. 10-2014-0026808, filed on Mar. 6, 2014, in the Korean Intellectual Property Office, and entitled: "Thin Film Transistor, Thin Film Transistor Substrate, Display Apparatus and Method of Manufacturing Thin Film Transistor," is incorporated by reference herein in its entirety.

BACKGROUND

1. Field

One or more embodiments relate to a thin film transistor, a thin film transistor substrate, a display apparatus, and a method of manufacturing a thin film transistor.

2. Description of the Related Art

A thin film transistor may perform various functions, such as, for example, a switching function, control of a current flow, or driving of an electric device, and may be used in various fields.

SUMMARY

Embodiments may be realized by providing a thin film transistor, including a gate electrode; an active layer insulated from the gate electrode; a source electrode and a drain electrode that are insulated from the gate electrode and are electrically connected to the active layer; a first etch stopper layer that is formed of an insulation material and contacts a portion of the active layer located between areas of the active layer that are electrically connected to the source electrode and the drain electrode; a second etch stopper layer on the first etch stopper layer, the second etch stopper layer being formed of an insulation material of a same type as the insulation material used to form the first etch stopper layer, the second etch stopper layer having a higher density than the first etch stopper layer; and a third etch stopper layer on the second etch stopper layer.

The first etch stopper layer and the second etch stopper layer may include an aluminum oxide, a titanium oxide, a tantalum oxide, or a gallium oxide.

The third etch stopper layer may be formed of an insulation material of a different type than the insulation materials used to form the first etch stopper layer and the second etch stopper layer.

The third etch stopper layer may include a silicon oxide.

The active layer may include an oxide semiconductor material.

The third etch stopper layer may be thicker than the first etch stopper layer and the second etch stopper layer.

Embodiments may be realized by providing a thin film transistor substrate, including a substrate; a gate electrode the substrate; an active layer insulated from the gate electrode; a source electrode and a drain electrode that are insulated from the gate electrode and are electrically connected to the active layer; a first etch stopper layer that is formed of an insulation material and contacts a portion of the active layer located between areas of the active layer that are electrically connected to the source electrode and the drain electrode; a second etch stopper layer on the first etch stopper layer, the second etch stopper layer being formed of an insulation material of a same type as the insulation material used to form the first etch stopper layer, the second etch stopper layer having a higher density than the first etch stopper layer; a third etch stopper layer on the second etch stopper layer; and a pixel electrode that is electrically connected to one of the source electrode and the drain electrode.

Embodiments may be realized by providing a display apparatus, including a substrate; a gate electrode on the substrate; an active layer insulated from the gate electrode; a source electrode and a drain electrode that are insulated from the gate electrode and are electrically connected to the active layer; a first etch stopper layer that is formed of an insulation material and contacts a portion of the active layer located between areas of the active layer that are electrically connected to the source electrode and the drain electrode; a second etch stopper layer on the first etch stopper layer, the second etch stopper layer being formed of an insulation material of a same type as the insulation material used to form the first etch stopper layer, the second etch stopper layer having a higher density than the first etch stopper layer; a third etch stopper layer on the second etch stopper layer; and a display device that is electrically connected to one of the source electrode and the drain electrode.

The display device may include a pixel electrode electrically connected to one of the source electrode and the drain electrode; a common electrode facing the pixel electrode; and a liquid crystal layer driven by the pixel electrode and the common electrode.

The display device may include a pixel electrode electrically connected to one of the source electrode and the drain electrode; an opposite electrode facing the pixel electrode; and an intermediate layer between the pixel electrode and the opposite electrode, the intermediate layer including at least one organic emission layer.

Embodiments may be realized by providing a method of manufacturing a thin film transistor, the method including forming a gate electrode; forming an active layer insulated from the gate electrode; forming a source electrode and a drain electrode that are insulated from the gate electrode and are electrically connected to the active layer; forming a first etch stopper layer using an insulation material such that the first etch stopper layer contacts a portion of the active layer located between areas of the active layer that are electrically connected to the source electrode and the drain electrode; forming a second etch stopper layer on the first etch stopper layer using an insulation material of a same type as the insulation material used to form the first etch stopper layer, wherein the second etch stopper layer has a higher density than the first etch stopper layer; and forming a third etch stopper layer on the second etch stopper layer.

The first etch stopper layer may be formed by a deposition method of a same type as a deposition method used to form the active layer.

The first etch stopper layer and the active layer may be formed by sputtering or an atomic layer deposition (ALD) method.

The first etch stopper layer may be formed by a deposition method of a same type as a deposition method used to form the second etch stopper layer.

A power for forming the first etch stopper layer may be lower than a power for forming the second etch stopper layer.

The third etch stopper layer may be formed by a deposition method of a different type than deposition methods used to form the first etch stopper layer and the second etch stopper layer.

The forming of the third etch stopper layer may be performed by a chemical vapor deposition (CVD) method.

The forming of the active layer may include forming a material layer of the active layer; forming the first etch stopper layer and the second etch stopper layer; and patterning the material layer of the active layer.

The active layer may be formed using an oxide semiconductor material.

The first etch stopper layer and the second etch stopper layer may be formed using an aluminum oxide, a titanium oxide, or a tantalum oxide or a gallium oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
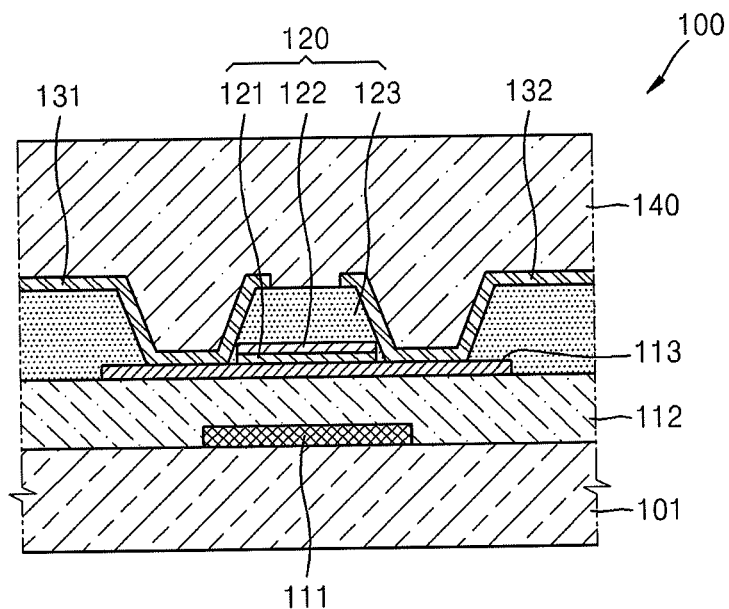
FIG. 1 illustrates a schematic cross-sectional view of a thin film transistor according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to the like elements throughout. Expressions such as "at least one of," when preceding a list of elements, modify the entire list of elements and do not modify the individual elements of the list.

Redundant explanations may be omitted.

It will be understood that although the terms "first", "second", etc. may be used herein to describe various components, these components should not be limited by these terms. These components are only used to distinguish one component from another.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

In the embodiments below, it will be understood when a portion of a layer, an area, or an element is referred to as being "on" or "above" another portion, it can be directly on or above the other portion, or an intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an-x axis, a y-axis, and a z-axis may be at right angles or not may also indicate different directions from one another, which are not at right angles.

When an embodiment is implementable in another manner, a predetermined process order may be different from a described one. For example, two processes that are described as being consecutively performed may be substantially simultaneously performed or may be performed in an order opposite than the described order.

FIG. 1 illustrates a schematic cross-sectional view of a thin film transistor 100 according to an embodiment.

Referring to FIG. 1, the thin film transistor 100 may be formed on a substrate 101, and may include a gate electrode 111, an active layer 113, an etch stopper 120, a source electrode 131, and a drain electrode 132.

The substrate 101 may be formed of a glass material including $SiO_2$ as a main component. In an embodiment, the substrate 101 may be formed of a plastic material, for example, an organic material. In an embodiment, the substrate 101 may be formed of a metal thin film.

Although not illustrated in FIG. 1, a buffer layer (not shown) may be formed on the substrate 101. The buffer layer (not shown) may prevent penetration of impurity elements into the substrate 101, may provide a planar surface on the substrate 101, and may be formed of various materials that may be used to perform these functions.

The gate electrode 111 may be formed on the substrate 101. The gate electrode 111 may be formed of a metal material having a good conductivity. For example, the gate electrode 111 may include Au, Ag, Cu, Ni, Pt, Pd, Al, or Mo, or an alloy such as an Al:Nd alloy or a Mo:W alloy.

The gate insulation layer 112 may be formed on the gate electrode 111. The gate insulation layer 112 may be formed of various insulation materials such as an oxide or a nitride. The gate insulation layer 112 may insulate the gate electrode 111 from the active layer 113.

The active layer 113 may be disposed on the gate insulation layer 112. The active layer 113 may include various materials. The active layer 113 may include an inorganic semiconductor material, an organic semiconductor material, or an oxide semiconductor material.

For example, the active layer 113 may include an oxide semiconductor material such as a ZnO-based oxide. In an embodiment, the active layer 113 may be formed of an oxide semiconductor material containing In, Ga, or Sn.

The etch stopper 120 may be disposed on the active layer 113. The etch stopper 120 may include a first etch stopper layer 121, a second etch stopper layer 122, and a third etch stopper layer 123.

The first etch stopper layer 121 and the second etch stopper layer 122 may be formed to correspond to at least a channel area of the active layer 113. The first etch stopper layer 121 and the second etch stopper layer 122 may correspond to an area of the active layer 113 located between areas of the active layer 113 that contact the source electrode 131 and the drain electrode 132.

The first etch stopper layer 121 may contact at least the channel area of the active layer 113. The first etch stopper layer 121 may contact an upper surface of the area of the active layer 113 located between the areas of the active layer 113 that contact the source electrode 131 and the drain electrode 132. The first etch stopper layer 121 may be formed using various insulation materials, as described below.

The second etch stopper layer 122 may be formed on the first etch stopper layer 121. For example, the second etch stopper layer 122 may be formed to contact an upper surface of the first etch stopper layer 121.

The first etch stopper layer 121 may formed of the same type of material as that of the second etch stopper layer 122. For example, the first etch stopper layer 121 and the second etch stopper layer 122 may be formed of an oxide.

According to an embodiment, the first etch stopper layer 121 and the second etch stopper layer 122 may be formed to include an aluminum oxide ($Al_xO_y$).

The first etch stopper layer 121 and the second etch stopper layer 122 may be formed to include an aluminum oxide ($Al_xO_y$), and a density of the first etch stopper layer 121 may be lower than that of the second etch stopper layer 122.

In an embodiment, the first etch stopper layer 121 and the second etch stopper layer 122 may be formed to include a titanium oxide ($Ti_xO_y$), and the density of the first etch stopper layer 121 may be lower than that of the second etch stopper layer 122.

In an embodiment, the first etch stopper layer 121 and the second etch stopper layer 122 may be formed to include a tantalum oxide ($Ta_xO_y$), and the density of the first etch stopper layer 121 may be lower than that of the second etch stopper layer 122.

In an embodiment, the first etch stopper layer 121 and the second etch stopper layer 122 may be formed to include a gallium oxide ($Ga_xO_y$), and the density of the first etch stopper layer 121 may be lower than that of the second etch stopper layer 122.

The first etch stopper layer 121 and the second etch stopper layer 122 may be continuously formed. The first etch stopper layer 121 and the second etch stopper layer 122 may be formed by the same deposition method, such as, for example, a sputtering method. A sputtering power used to form the first etch stopper layer 121 may be set to be lower than a sputtering power used to form the second etch stopper layer 122, and the density of the first etch stopper layer 121 may be lower than the density of the second etch stopper layer 122.

In an embodiment, the first etch stopper layer 121 and the second etch stopper layer 122 may be formed by an atomic layer deposition (ALD) method.

A third etch stopper layer 123 may be formed on the first etch stopper layer 121 and the second etch stopper layer 122. The third etch stopper layer 123 may be formed of a material that is different from that used to form the first etch stopper layer 121 and the second etch stopper layer 122. For example, the third etch stopper layer 123 may be formed of a silicon oxide ($Si_xO_y$).

Including the third etch stopper layer 123 that is formed of a different type of insulation material having characteristics that are different than the characteristics of the first etch stopper layer 121 and the second etch stopper layer 122, which are formed of the same type of insulation material as each other, may help improve insulation characteristics of the etch stopper 120 and protection of the active layer 113.

The third etch stopper layer 123 may be formed by a manufacturing method different from that used to form the first etch stopper layer 121 and the second etch stopper layer 122. For example, the third etch stopper layer 123 may be deposited by a chemical vapor deposition (CVD) method.

FIG. 1 illustrates the third etch stopper layer 123 extending from an upper portion of the first etch stopper layer 121 and the second etch stopper layer 122 and from a boundary portion of the active layer 113.

In an embodiment, the third etch stopper layer 123 may be formed only on the first etch stopper layer 121 and the second etch stopper layer 122.

In an embodiment, the third etch stopper layer 123 may be formed to cover upper portions and lateral surfaces of the first etch stopper layer 121 and the second etch stopper layer 122.

The source electrode 131 and the drain electrode 132 may be connected to the active layer 113. For example, the source electrode 131 and the drain electrode 132 may be formed to contact two portions of the upper surface area of the active layer 113 that are not covered by the first etch stopper layer 121 and the second etch stopper layer 122.

When forming the third etch stopper layer 123, portions of the upper surface area of the active layer 113 that are not covered by the first etch stopper layer 121 and the second etch stopper layer 122 may be exposed, and the source electrode 131 and the drain electrode 132 may be formed to contact the exposed portions of the upper surface of the active layer 113.

In an embodiment, a passivation layer 140 may be formed to cover the source electrode 131 and the drain electrode 132.

The thin film transistor 100 of FIG. 1 may be manufactured in various manners. A manufacturing method of the thin film transistor 100 according to an embodiment will be described below.

The gate electrode 111 may be formed on the substrate 101. A buffer layer (not shown) may be formed on the substrate 101 before forming the gate electrode 111 on the substrate 101.

The gate insulation layer 112 may be formed on the gate electrode 111.

Next, a preliminary layer used to form the active layer 113, for example, a material layer of the active layer 113, such as an oxide semiconductor layer, may be formed on the gate insulation layer 112. The material layer of the active layer 113, such as an oxide semiconductor layer, may be formed by sputtering. In an embodiment, the material layer of the active layer 113 may be formed by an ALD method.

Next, the first etch stopper layer 121 and the second etch stopper layer 122 of the etch stopper 120 may be formed on the material layer of the active layer 113. For example, a material layer of the first etch stopper layer 121 including an aluminum oxide ($Al_xO_y$) may be formed. The material layer of the first etch stopper layer 121 including an aluminum oxide ($Al_xO_y$) may be formed by sputtering. The material layer of the first etch stopper layer 121 may be formed by an ALD method. When forming the material layer of the first etch stopper layer 121, the same method as a deposition method whereby the active layer 113 is formed may be used.

The material layer of the first etch stopper layer 121 may be formed by the same method as the method of forming the active layer 113. Accordingly, forming of the material layer of the first etch stopper layer 121 may be started without modifying a process pressure of an atmosphere in which the material layer of the active layer 113 is formed, such as a vacuum atmosphere.

Accordingly, a surface variation of the upper surface of the material layer of the active layer 113 may be reduced, and surface characteristics of a channel area of the active layer 113 from among the upper surface area of the active layer 113, which is to be formed later, corresponding to the first etch stopper layer 121, may be improved.

The material layer of the first etch stopper layer 121 may be formed by, for example, sputtering, and damage to the upper surface of the material layer of the active layer 113 may be prevented by controlling a sputtering power. A sputtering power may be reduced, and damage to the upper surface of the material layer of the active layer 113 may be reduced or prevented.

The material layer of the second etch stopper layer 122 may be formed on the material layer of the first etch stopper layer 121. For example, the material layer of the second etch stopper layer 122 including an aluminum oxide ($Al_xO_y$) may be formed. The material layer of the second etch stopper layer 122 may be formed by a sputtering operation, for example, using a sputtering power that is higher than that used when forming the material layer of the first etch stopper layer 121. Accordingly, the material layer of the second etch stopper layer 122 may have a higher density than the material layer of the first etch stopper layer 121, and an upper surface of the active layer 113 may be effectively protected.

The first etch stopper layer 121 may be formed by an ALD method as described above, the material layer of the second etch stopper layer 122 may be formed by an ALD method, and a sputtering power used in forming the material layer of the second etch stopper layer 122 may be higher than that used when forming the material layer of the first etch stopper layer 121.

Next, the material layer of the first etch stopper layer 121 and the material layer of the second etch stopper layer 122 may be simultaneously patterned to form the first etch stopper layer 121 and the second etch stopper layer 122.

In an embodiment, the first etch stopper layer 121 and the second etch stopper layer 122 may be formed to include a titanium oxide ($Ti_xO_y$), a tantalum oxide ($Ta_xO_y$) or a gallium oxide ($Ga_xO_y$).

Next, the material layer of the active layer 113 may be patterned to form the active layer 113.

For example, after forming the material layer of the active layer 113, but before forming the active layer 113 by patterning, the material layer of the first etch stopper layer 121 and the material layer of the second etch stopper layer 122 may be formed. For example, by forming the material layer of the first etch stopper layer 121 and the material layer of the second etch stopper layer 122, surface damage to the material layer of the active layer 113 may be prevented to surface characteristics and electrical characteristics of the active layer 113 may be improved.

The third etch stopper layer 123 may be formed to have an appropriate thickness, and the third etch stopper layer 123 may be formed on the first etch stopper layer 121 and the second etch stopper layer 122.

The third etch stopper layer 123 may include a silicon oxide ($Si_xO_y$), may be formed by a CVD method, and may be thicker than the first etch stopper layer 121 and the second etch stopper layer 122. For example, the third etch stopper layer 123 may be formed to have a thickness for achieving an appropriate total thickness of the etch stopper 120.

In an embodiment, the third etch stopper layer 123 may be formed only on the first etch stopper layer 121 and the second etch stopper layer 122. For example, the third etch stopper layer 123 may be patterned at the same time as the first etch stopper layer 121 and the second etch stopper layer 122.

In an embodiment, after forming the material layer of the active layer 113, the material layer of the first etch stopper layer 121, the material layer of the second etch stopper layer 122, and the material layer of the third etch stopper layer 123, and after forming the third etch stopper layer 123 by patterning, the third etch stopper layer 123 may be used as an etching mask or an additional etching mask may be used to form the active layer 113, the first etch stopper layer 121, and the second etch stopper layer 122.

According to an embodiment, at least the material layer of the active layer 113 and the material layer of the first etch stopper layer 121 may be continuously formed.

The source electrode 131 and the drain electrode 132 may be connected to the active layer 113, and the passivation layer 140 may be formed to cover the source electrode 131 and the drain electrode 132 to complete the thin film transistor 100.

In the thin film transistor 100 according to an embodiment, the first etch stopper layer 121 may be formed to correspond to a portion of an upper surface area of the active layer 113 between areas of the active layer 113 contacting the source electrode 131 and the drain electrode 132, which is a channel area of the active layer 113. The second etch stopper layer 122 may be formed on the first etch stopper layer 121.

The first etch stopper layer 121 may contact the upper surface of the active layer 113, and may protect an area of the active layer 113, for example, the channel area. The first etch stopper layer 121 may be formed of the same type of deposition method as that used in forming the active layer 113.

For example, the first etch stopper layer 121 may be formed by a sputtering method and the active layer 113 may also be formed by a sputtering method, a process atmosphere may not be abruptly modified, and surface damage to the upper surface of the active layer 113 may be prevented.

A sputtering power when sputtering of the first etch stopper layer 121 may be reduced as much as possible to prevent damage of a surface of the active layer 113 when the first etch stopper layer 121 is sputtered. The second etch stopper layer 122 may be formed by the same type of material as the first etch stopper layer 121 and by the same method, for example, sputtering, and a sputtering power during the sputtering may be increased, and the density of the second etch stopper layer 122 may be higher than that of the first etch stopper layer 121. Accordingly, the second etch stopper layer 122 may easily protect the first etch stopper layer 121 and a surface of the active layer 113 corresponding to the first etch stopper layer 121. In general, a surface of the active layer 113, which may include an oxide semiconductor material, may be susceptible to damage, which may decrease electrical characteristics of the active layer 113. However, according to the present embodiment, the first etch stopper layer 121 and the second etch stopper layer 122 may prevent a decrease in the electrical characteristics of the active layer 113.

The first etch stopper layer 121 and the second etch stopper layer 122 may be formed of an aluminum oxide, a titanium oxide, a tantalum oxide or a gallium oxide, which can serve as insulation materials having excellent characteristics for preventing moisture penetration. Thus, protection of the active layer 113 via the first etch stopper layer 121 and the second etch stopper layer 122 may be enhanced.

In addition, the third etch stopper layer 123 may be formed of a material that is different from that used to form the first etch stopper layer 121 and the second etch stopper layer 122, the etch stopper 120 may include two types of insulation materials having different insulation characteristics, and insulation characteristics of the etch stopper 120 and protection of the active layer 113 may be improved.

The third etch stopper layer 123 may be thicker than the first etch stopper layer 121 and the second etch stopper layer 122, the first etch stopper layer 121 and the second etch stopper layer 122 may be protected, and penetration of foreign substances, moisture or an external air into the active layer 113, which may cause damage to the active layer 113, may be effectively prevented.

Figure 2:
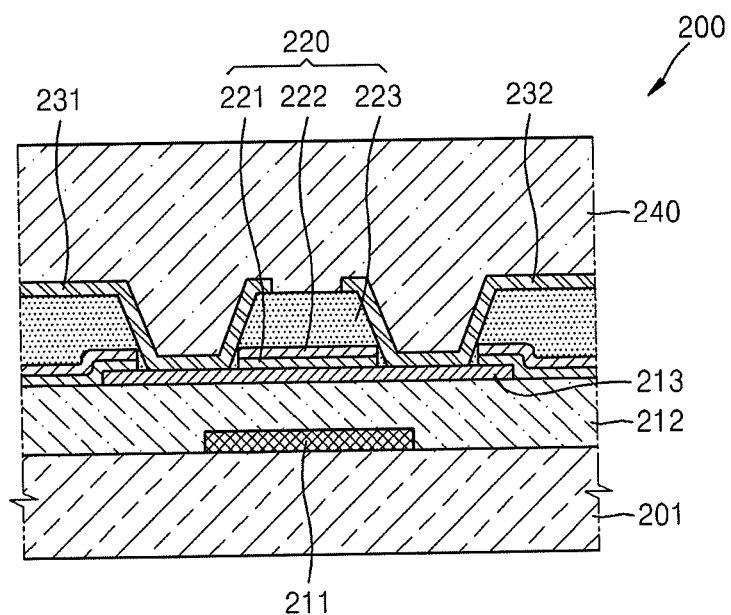
FIG. 2 illustrates a schematic cross-sectional view of a thin film transistor according to another embodiment.

FIG. 2 illustrates a schematic cross-sectional view of a thin film transistor 200 according to another embodiment.

Referring to FIG. 2, the thin film transistor 200 may include a substrate 201, a gate electrode 211, an active layer 213, an etch stopper 220, a source electrode 231, and a drain electrode 232.

For convenience of description, the description of the present embodiment will focus on differences from the previous embodiment.

The gate electrode 211 may be formed on the substrate 201. A gate insulation layer 212 may be formed on the gate electrode 211. The active layer 213 may be disposed on the gate insulation layer 212. The active layer 213 may include various materials. For example, the active layer 213 may include an inorganic semiconductor material, an organic semiconductor material or an oxide semiconductor material. For example, the active layer 213 may include an oxide semiconductor material, such as a ZnO-based oxide. The active layer 213 may also be formed of an oxide semiconductor material including In, Ga, or Sn.

The etch stopper 220 may disposed on the active layer 213. The etch stopper 220 may include a first etch stopper layer 221, a second etch stopper layer 222, and a third etch stopper layer 223.

The first etch stopper layer 221 and the second etch stopper layer 222 may be formed to correspond to at least a channel area of the active layer 213 and a boundary portion of the active layer 213.

The first etch stopper layer 221 and the second etch stopper layer 222 may be formed of an insulation material of the same type. For example, the first etch stopper layer 221 and the second etch stopper layer 222 may be formed of an oxide.

According to an embodiment, the first etch stopper layer 221 and the second etch stopper layer 222 may be formed to include an aluminum oxide ($Al_xO_y$).

The first etch stopper layer 221 and the second etch stopper layer 222 may be formed to include an aluminum oxide ($Al_xO_y$), and the density of the first etch stopper layer 221 may be lower than that of the second etch stopper layer 222.

In an embodiment, the first etch stopper layer 221 and the second etch stopper layer 222 may be formed to include a titanium oxide ($Ti_xO_y$), and the density of the first etch stopper layer 221 may be lower than that of the second etch stopper layer 222.

In an embodiment, the first etch stopper layer 221 and the second etch stopper layer 222 may be formed to include a titanium oxide ($Ti_xO_y$), and the density of the first etch stopper layer 221 may be lower than that of the second etch stopper layer 222.

In an embodiment, the first etch stopper layer 221 and the second etch stopper layer 222 may be formed to include a gallium oxide ($Ga_xO_y$), and the density of the first etch stopper layer 221 may be lower than that of the second etch stopper layer 222.

The third etch stopper layer 223 may be formed on the first etch stopper layer 221 and the second etch stopper layer 222.

The source electrode 231 and the drain electrode 232 may be connected to the active layer 213.

A passivation layer 240 may be formed to cover the source electrode 231 and the drain electrode 232. In an embodiment, the passivation layer 240 may be omitted.

The thin film transistor 200 of FIG. 2 may be manufactured in various manners. A manufacturing method of the thin film transistor 200 according to an embodiment will be described below.

The gate electrode 211 may be formed on the substrate 201. A buffer layer (not shown) may be formed on the substrate 201 before forming the gate electrode 211 on the substrate 201.

The gate insulation layer 212 may be formed on the gate electrode 211.

Next, the active layer 213 may be formed. The active layer 213 may be formed to include, for example, an oxide semiconductor layer, by sputtering. In an embodiment, a material layer of the active layer 213 may be formed by an ALD method.

Next, the first etch stopper layer 221 and the second etch stopper layer 222 of the etch stopper 220 may be formed on the active layer 213. For example, a material layer of the first etch stopper layer 221 including an aluminum oxide ($Al_xO_y$) may be formed. The material layer of the first etch stopper layer 221 including an aluminum oxide ($Al_xO_y$) may be formed by sputtering. The material layer of the first etch stopper layer 221 may be formed by an ALD method. The material layer of the first etch stopper layer 221 may be formed by a same method as a deposition method used to form the active layer 213.

The material layer of the second etch stopper layer 222 may be formed on the material layer of the first etch stopper layer 221. For example, the material layer of the second etch stopper layer 222 including an aluminum oxide ($Al_xO_y$) may be formed. The material layer of the second etch stopper layer 222 may be formed by sputtering, for example, using a sputtering power that may be higher than that used when forming the material layer of the first etch stopper layer 221. The material layer of the second etch stopper layer 222 may have a higher density than the material layer of the first etch stopper layer 221, and an upper surface of the active layer 213 may be effectively protected.

When forming the first etch stopper layer 221 using an ALD method as described above, the material layer of the second etch stopper layer 222 may be formed by an ALD method, and when forming the material layer of the second etch stopper layer 222, a sputtering power may be used that is higher than that used when forming the material layer of the first etch stopper layer 221.

Next, the material layer of the first etch stopper layer 221 and the material layer of the second etch stopper layer 222 may be simultaneously patterned to form the first etch stopper layer 221 and the second etch stopper layer 222, respectively. In an embodiment, the material layer of the first etch stopper layer 221 and the material layer of the second etch stopper layer 222 may be simultaneously patterned to form the first etch stopper layer 221 and the second etch stopper layer 222, respectively, in a patterning operation of forming the third etch stopper layer 223.

The third etch stopper layer 223 may include a silicon oxide ($Si_xO_y$), may be formed by a CVD method, and may be thicker than the first etch stopper layer 221 and the second etch stopper layer 222. The third etch stopper layer 223 may be formed to have a thickness for achieving an appropriate total thickness of the etch stopper 120.

In an embodiment, the first etch stopper layer 221 and the second etch stopper layer 222 may be formed to include a titanium oxide ($Ti_xO_y$), a tantalum oxide ($Ta_xO_y$) or a gallium oxide ($Ga_xO_y$), for example, by a sputtering operation. When forming the first etch stopper layer 221, a power may be lower than when forming the first etch stopper layer 221. Accordingly, the density of the first etch stopper layer 221 may be lower than that of the second etch stopper layer 222.

The source electrode 231 and the drain electrode 232 may be connected to the active layer 213, and the passivation layer 240 may be formed to cover the source electrode 231 and the drain electrode 232 to complete the thin film transistor 200.

In the thin film transistor 200 according to an embodiment, the first etch stopper layer 221 may be formed to correspond to a portion of an upper surface area of the active layer 213 located between areas of the active layer 213 contacting the source electrode 231 and the drain electrode 232, which is a channel area of the active layer 213. The second etch stopper layer 222 may be formed on the first etch stopper layer 221.

The first etch stopper layer 221 may contact the upper surface of the active layer 213, and may protect an area of the active layer 213, for example, the channel area. The first etch stopper layer 221 and the active layer 213 may be formed by the same type of deposition method.

For example, the first etch stopper layer 221 may be formed by a sputtering method and the active layer 213 may also be formed by a sputtering method, a process atmosphere may not be abruptly modified, and surface damage to the upper surface of the active layer 213 may be prevented.

A sputtering power when sputtering of the first etch stopper layer 221 may be reduced as much as possible to prevent damage of a surface of the active layer 213 when the first etch stopper layer 221 is sputtered. The second etch stopper layer 222 may be formed using the same type of material as the first etch stopper layer 221 and by the same method, for example, sputtering, and a sputtering power during the sputtering may be increased, and the density of the second etch stopper layer 222 may be higher than that of the first etch stopper layer 221. Accordingly, the second etch stopper layer 222 may easily protect the first etch stopper layer 221 and a surface of the active layer 213 corresponding to the first etch stopper layer 221.

In addition, the third etch stopper layer 223 may be formed of a material that is different from that used to form the first etch stopper layer 221 and the second etch stopper layer 222, the etch stopper 220 may include two types of insulation materials having different insulation characteristics, and insulation characteristics of the etch stopper 220 and protection of the active layer 213 may be improved.

As the third etch stopper layer 223 may be thicker than the first etch stopper layer 221 and the second etch stopper layer 222, the first etch stopper layer 221 and the second etch stopper layer 222 may be protected, and penetration of foreign substances, moisture or an external air into the active layer 213, which may cause damage to the active layer 213, may be effectively prevented.

Figure 3:
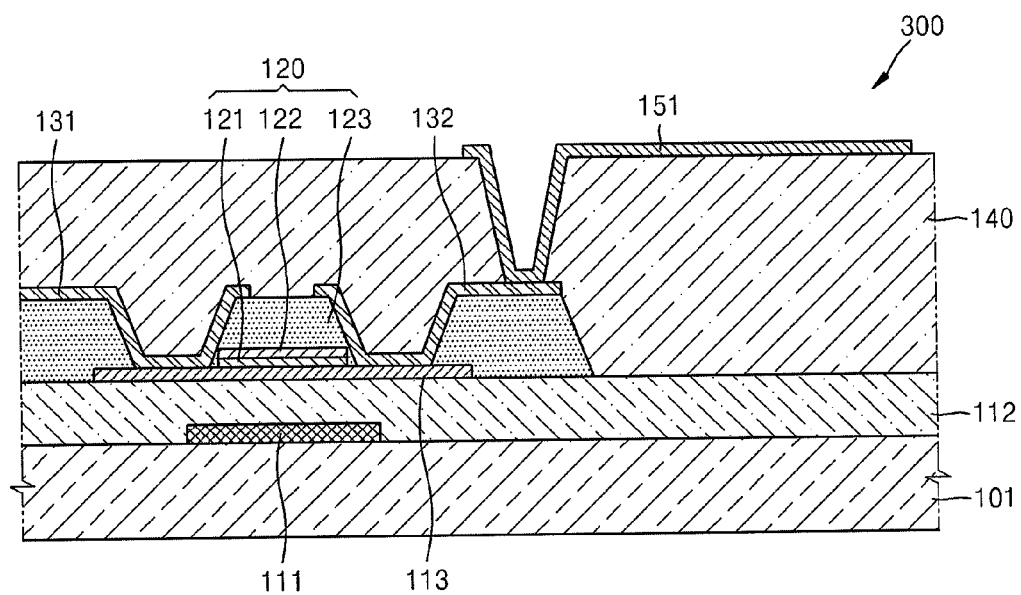
FIG. 3 illustrates a schematic cross-sectional view of a thin film transistor substrate according to an embodiment.

FIG. 3 illustrates a schematic cross-sectional view of a thin film transistor substrate 300 according to an embodiment.

Referring to FIG. 3, the thin film transistor substrate 300 may include a substrate 101, a gate electrode 111, an active layer 113, an etch stopper 120, a source electrode 131, a drain electrode 132, and a pixel electrode 151.

The substrate 101, the gate electrode 111, the active layer 113, the etch stopper 120, the source electrode 131, and the drain electrode 132 may have the same structures as those of elements of FIG. 1 which correspond thereto. Thus, a detailed description thereof will be omitted.

The pixel electrode 151 may be formed on a passivation layer 140 that may be selectively formed on the drain electrode 132. The pixel electrode 151 may be electrically connected to one of the source electrode 131 and the drain electrode 132. According to an embodiment, the pixel electrode 151 may be electrically connected to the drain electrode 132 as illustrated in FIG. 3.

In an embodiment, the thin film transistor substrate 300 may include the substrate 201, the gate electrode 211, the active layer 213, the etch stopper 220, the source electrode 231, and the drain electrode 232 of FIG. 2 described above without any changes thereto.

In the thin film transistor substrate 300 according to the an embodiment, the first etch stopper layer 121 may be formed to correspond to a portion of an upper surface area of the active layer 113 between areas of the active layer 113 contacting the source electrode 131 and the drain electrode 132, which is a channel area of the active layer 113. The second etch stopper layer 122 may be formed on the first etch stopper layer 121.

The first etch stopper layer 121 may contact an upper surface of the active layer 113, and may protect an area of the active layer 113, for example, the channel area. The first etch stopper layer 121 and the active layer 113 may be formed by the same type of deposition method.

Like in previously described embodiments, the thin film transistor substrate 300 may prevent surface damage to the upper surface of the active layer 113.

For example, if a surface of the active layer 113, which may include an oxide semiconductor material, is damaged, electrical characteristics of the active layer 113 may decrease. However, the first etch stopper layer 121 and the second etch stopper layer 122 may prevent a decrease in electrical characteristic of the active layer 113.

In addition, the third etch stopper layer 123 may be formed of a material that is different from that used to form the first etch stopper layer 121 and the second etch stopper layer 122, the etch stopper 120 may include two types of insulation materials having different insulation characteristics, and insulation characteristics of the etch stopper 120 and protection of the active layer 113 may be improved.

As the third etch stopper layer 123 may be thicker than the first etch stopper layer 121 and the second etch stopper layer 122, the first etch stopper layer 121 and the second etch stopper layer 122 may be protected, and penetration of foreign substances, moisture or an external air into the active layer 113, which may cause damage to the active layer 113, may be effectively prevented.

The thin film transistor substrate 300 may be applied to a display apparatus or other various electric devices.

Figure 4:
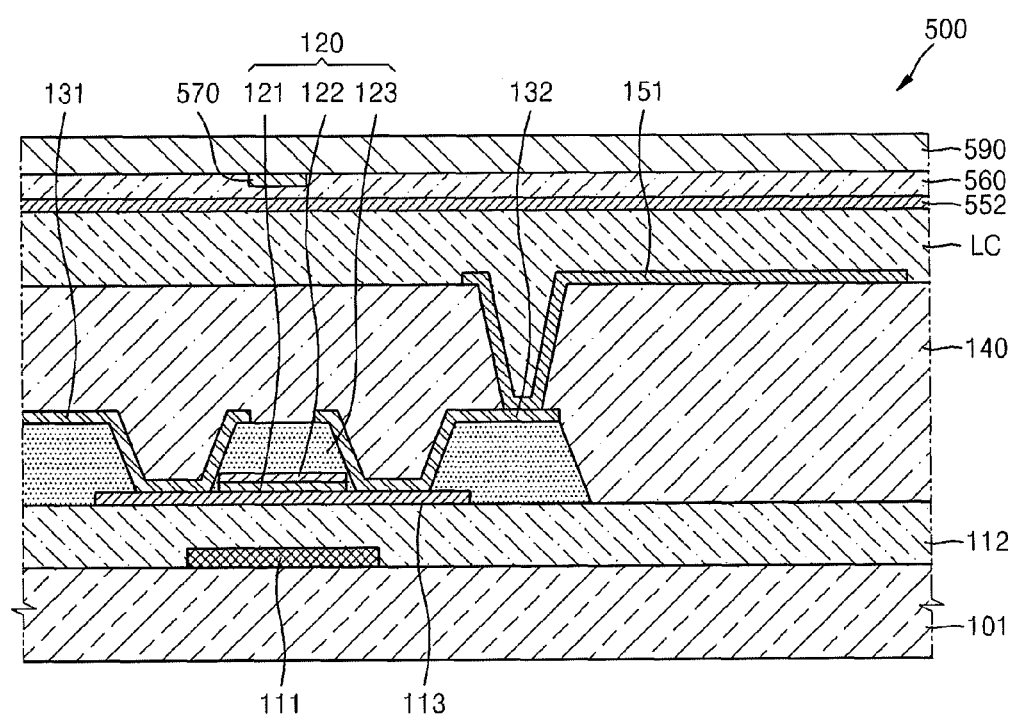
FIG. 4 illustrates a schematic cross-sectional view of a display apparatus according to an embodiment.

FIG. 4 illustrates a schematic cross-sectional view of a display apparatus 500 according to an embodiment.

Referring to FIG. 4, the display apparatus 500 may include a substrate 101, a gate electrode 111, an active layer 113, an etch stopper 120, a source electrode 131, a drain electrode 132, a pixel electrode 151, a liquid crystal (LC) layer, a common electrode 552, and a color filter 560.

The substrate 101, the gate electrode 111, the active layer 113, the etch stopper 120, the source electrode 131, and the drain electrode 132 may have the same structures as those of elements of FIG. 1. Thus, a detailed description thereof will be omitted. The pixel electrode 151 may formed on the passivation layer 140 that may be selectively formed on the drain electrode 132. The pixel electrode 151 may be electrically connected to one of the source electrode 131 and the drain electrode 132. According to an embodiment, the pixel electrode 151 may be electrically connected to the drain electrode 132 as illustrated in FIG. 4.

In an embodiment, the display apparatus 500 may include the substrate 201, the gate electrode 211, the active layer 213, the etch stopper 220, the source electrode 231, and the drain electrode 232 of FIG. 2 described above without any changes thereto.

The LC layer may be disposed on the pixel electrode 151, the common electrode 552 may be formed on the LC layer, and the color filter 560 and the black matrix 570 may be formed on the common electrode 552. An encapsulation member 590 may be disposed on the color filter 560 and the black matrix 570.

The display apparatus 500 is an example of a liquid crystal display apparatus. The display apparatus 500 is not limited thereto. The display apparatus 500 may have various structures by modifying positions of the color filter 560 and the black matrix 570 and positions of the LC layer and the common electrode 552 in various manners.

In the display apparatus 500 according to an embodiment, the first etch stopper layer 121 may be formed to correspond to a portion of an upper surface area of the active layer 113 between areas of the active layer 113 contacting the source electrode 131 and the drain electrode 132, which is a channel area of the active layer 113. The second etch stopper layer 122 may be formed on the first etch stopper layer 121.

The first etch stopper layer 121 may contact an upper surface of the active layer 113 to protect an area of the active layer 113, for example, the channel area. The first etch stopper layer 121 and the active layer 113 may be formed by the same type of deposition method.

Like in previous embodiments, the display apparatus 500 according to an embodiment may prevent surface damage to the upper surface of the active layer 113.

For example, if a surface of the active layer 113, which may include an oxide semiconductor material, is damaged, electrical characteristics of the active layer 113 may decrease. However, the first etch stopper layer 121 and the second etch stopper layer 122 according to an embodiment may prevent a decrease in electrical characteristics of the active layer 113.

In addition, the third etch stopper layer 123 may be formed of a material that is different from that used to form the first etch stopper layer 121 and the second etch stopper layer 122, the etch stopper 120 may include two types of insulation materials having different insulation characteristics, and insulation characteristics of the etch stopper 120 and protection of the active layer 113 may be improved.

As the third etch stopper layer 123 may be thicker than the first etch stopper layer 121 and the second etch stopper layer 122, the first etch stopper layer 121 and the second etch stopper layer 122 may be protected, and penetration of foreign substances, moisture or an external air into the active layer 113, which may cause damage to the active layer 113, may be effectively prevented.

Accordingly, electrical characteristics of the display apparatus 500 may be improved to easily improve an image quality of the display apparatus 500.

Figure 5:
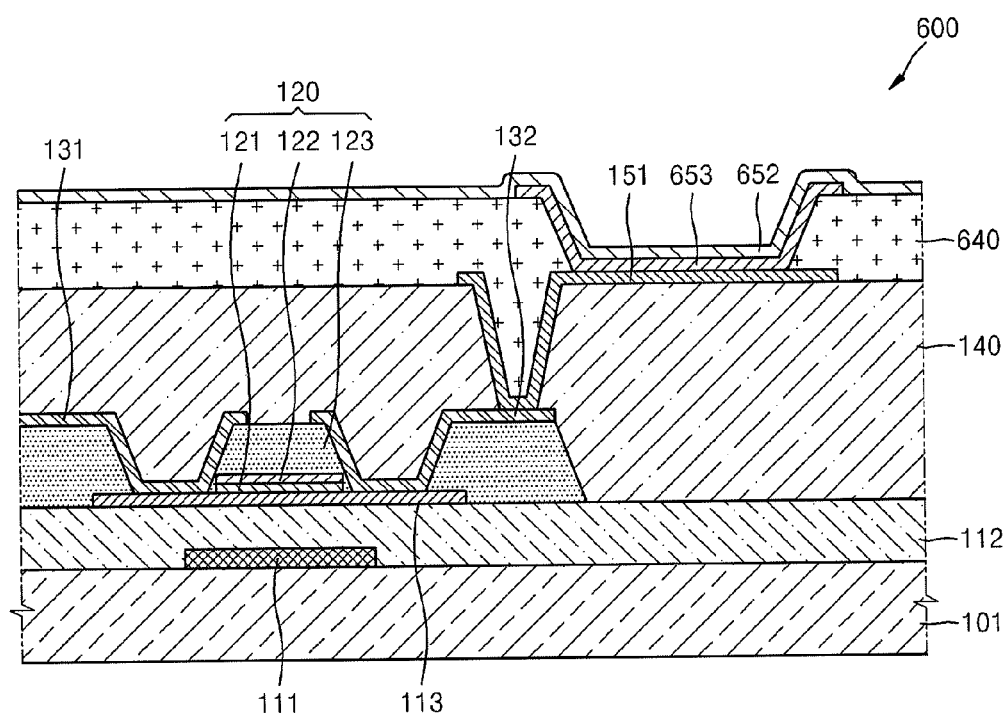
FIG. 5 illustrates a schematic cross-sectional view of a display apparatus according to another embodiment.

FIG. 5 illustrates a schematic cross-sectional view of a display apparatus 600 according to another embodiment.

Referring to FIG. 5, the display apparatus 600 may include a substrate 101, a gate electrode 111, an active layer 113, an etch stopper 120, a source electrode 131, a drain electrode 132, a pixel electrode 151, an intermediate layer 653, and an opposite electrode 652.

The substrate 101, the gate electrode 111, the active layer 113, the etch stopper 120, the source electrode 131, and the drain electrode 132 may have the same structures as those of elements of FIG. 1, which correspond thereto. Thus, a detailed description thereof will be omitted.

The pixel electrode 151 may be formed on the passivation layer 140 that may be selectively formed on the drain electrode 132. The pixel electrode 151 may be electrically connected to one of the source electrode 131 and the drain electrode 132. According to an embodiment, the pixel electrode 151 may be electrically connected to the drain electrode 132, as illustrated in FIG. 5.

In an embodiment, the display apparatus 600 may include the substrate 201, the gate electrode 211, the active layer 213, the etch stopper 220, the source electrode 231, and the drain electrode 232 of FIG. 2 described above without any changes thereto.

A pixel defining layer 640 may be formed on the pixel electrode 151, and the intermediate layer 653 may be formed on an upper surface of the pixel electrode 151 that may be exposed when forming the pixel defining layer 640.

The intermediate layer 653 may include at least one organic emission layer. The intermediate layer 653 may selectively further include at least one of a hole injection layer, a hole transport layer, an electron transport layer, and an electron injection layer.

The opposite electrode 652 may be formed on the intermediate layer 653. While not illustrated in FIG. 5, an encapsulation member (not shown) may be disposed on the opposite electrode 652.

The display apparatus 600 is an example of a liquid crystal display apparatus. However, the display apparatus 600 may have various structures.

In the display apparatus 600 according to an embodiment, the first etch stopper layer 121 may be formed to correspond to a portion of an upper surface area of the active layer 113 between areas of the active layer 113 contacting the source electrode 131 and the drain electrode 132, which is a channel area of the active layer 113. The second etch stopper layer 122 may be formed on the first etch stopper layer 121.

The first etch stopper layer 121 may contact the upper surface of the active layer 113, and may protect an area of the active layer 113, for example, the channel area. The first etch stopper layer 121 and the active layer 113 may be formed by the same type of deposition method.

As in the above-described embodiment, the display apparatus 600 according to an embodiment may prevent surface damage to the upper surface of the active layer 113.

For example, if a surface of the active layer 113, which may include an oxide semiconductor material, is damaged, electrical characteristics of the active layer 113 may decrease. However, the first etch stopper layer 121 and the second etch stopper layer 122 according to an embodiment may prevent a decrease in electrical characteristics of the active layer 113.

In addition, the third etch stopper layer 123 may be formed of a material that is different from that used to form the first etch stopper layer 121 and the second etch stopper layer 122, the etch stopper 120 may include two types of insulation materials having different insulation characteristics, and insulation characteristics of the etch stopper 120 and protection of the active layer 113 may be improved.

As the third etch stopper layer 123 may be thicker than the first etch stopper layer 121 and the second etch stopper layer 122, the first etch stopper layer 121 and the second etch stopper layer 122 may be protected, and penetration of foreign substances, moisture or an external air into the active layer 113, which may cause damage to the active layer 113, may be effectively prevented.

Accordingly, electrical characteristics of the display apparatus 600 may be improved, and an image quality of the display apparatus 600 may be improved.

According to one or more embodiments, electrical characteristics of a thin film transistor, a thin film transistor substrate, and a display apparatus may be improved, and image quality characteristics of the display apparatus may be easily improved.

By way of summation and review, portable thin flat panel display apparatuses may commonly be used as display apparatuses and may widely be used in flat panel display apparatuses. A thin film transistor may include an active layer including a semiconductor material, a gate electrode, a source electrode, and a drain electrode. Characteristics of an electric device in which a thin film transistor is used may greatly vary according to characteristics of the thin film transistor, for example, according to electrical characteristics of the thin film transistor.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor, comprising:
a gate electrode;
an active layer insulated from the gate electrode;
a source electrode and a drain electrode that are insulated from the gate electrode and contact a portion of the active area so as to be electrically connected to the active layer;
a first etch stopper layer that is formed of an insulation material using a first sputtering power and contacts a portion of the active layer located between areas of the active layer that are electrically connected to the source electrode and the drain electrode;
a second etch stopper layer on the first etch stopper layer, the second etch stopper layer being formed of an insulation material of a same type as the insulation material used to form the first etch stopper layer using a second sputtering power; and
a third etch stopper layer on the second etch stopper layer, wherein
the second sputtering power is greater than the first sputtering power such that a density of the second etch stopper layer is greater than that of the first etch stopper layer.

2. The thin film transistor as claimed in claim 1, wherein the first etch stopper layer and the second etch stopper layer include an aluminum oxide, a titanium oxide, a tantalum oxide, or a gallium oxide.

3. The thin film transistor as claimed in claim 1, wherein the third etch stopper layer is formed of an insulation material of a different type than the insulation materials used to form the first etch stopper layer and the second etch stopper layer.

4. The thin film transistor as claimed in claim 1, wherein the third etch stopper layer includes a silicon oxide.

5. The thin film transistor as claimed in claim 1, wherein the active layer includes an oxide semiconductor material.

6. The thin film transistor as claimed in claim 1, wherein the third etch stopper layer is thicker than the first etch stopper layer and the second etch stopper layer.

7. A thin film transistor substrate, comprising:
a substrate;
a gate electrode the substrate;
an active layer insulated from the gate electrode;
a source electrode and a drain electrode that are insulated from the gate electrode and contact a portion of the active area so as to be electrically connected to the active layer;
a first etch stopper layer that is formed of an insulation material using a first sputtering power and contacts a portion of the active layer located between areas of the active layer that are electrically connected to the source electrode and the drain electrode;
a second etch stopper layer on the first etch stopper layer, the second etch stopper layer being formed of an insulation material of a same type as the insulation material used to form the first etch stopper layer using a second sputtering power;
a third etch stopper layer on the second etch stopper layer; and
a pixel electrode that is electrically connected to one of the source electrode and the drain electrode, wherein
the second sputtering power is greater than the first sputtering power such that a density of the second etch stopper layer is greater than that of the first etch stopper layer.

8. A display apparatus, comprising:
a substrate;
a gate electrode on the substrate;
an active layer insulated from the gate electrode;
a source electrode and a drain electrode that are insulated from the gate electrode and contact a portion of the active area so as to be electrically connected to the active layer;
a first etch stopper layer that is formed of an insulation material using a first sputtering power and contacts a portion of the active layer located between areas of the active layer that are electrically connected to the source electrode and the drain electrode;
a second etch stopper layer on the first etch stopper layer, the second etch stopper layer being formed of an insulation material of a same type as the insulation material used to form the first etch stopper layer using a second sputtering power;
a third etch stopper layer on the second etch stopper layer; and
a display device that is electrically connected to one of the source electrode and the drain electrode, wherein
the second sputtering power is greater than the first sputtering power such that a density of the second etch stopper layer is greater than that of the first etch stopper layer.

9. The display apparatus as claimed in claim 8, wherein the display device includes:

a pixel electrode electrically connected to one of the source electrode and the drain electrode;
a common electrode facing the pixel electrode; and
a liquid crystal layer driven by the pixel electrode and the common electrode.

10. The display apparatus as claimed in claim 8, wherein the display device includes:
a pixel electrode electrically connected to one of the source electrode and the drain electrode;
an opposite electrode facing the pixel electrode; and
an intermediate layer between the pixel electrode and the opposite electrode, the intermediate layer including at least one organic emission layer.

11. A method of manufacturing a thin film transistor, the method comprising:
forming a gate electrode;
forming an active layer insulated from the gate electrode;
forming a source electrode and a drain electrode that are insulated from the gate electrode and contact a portion of the active area so as to be electrically connected to the active layer;
forming a first etch stopper layer using an insulation material using a first sputtering power such that the first etch stopper layer contacts a portion of the active layer located between areas of the active layer that are electrically connected to the source electrode and the drain electrode;
forming a second etch stopper layer on the first etch stopper layer using an insulation material of a same type as the insulation material used to form the first etch stopper layer using a second sputtering power, wherein the second sputtering power is greater than the first sputtering power such that the second etch stopper layer has a higher density than the first etch stopper layer; and
forming a third etch stopper layer on the second etch stopper layer.

12. The method as claimed in claim 11, wherein the first etch stopper layer is formed by a deposition method of a same type as a deposition method used to form the active layer.

13. The method as claimed in claim 12, wherein the first etch stopper layer and the active layer are formed by sputtering or an atomic layer deposition (ALD) method.

14. The method as claimed in claim 11, wherein the first etch stopper layer is formed by a deposition method of a same type as a deposition method used to form the second etch stopper layer.

15. The method as claimed in claim 11, wherein:
the third etch stopper layer is formed by a deposition method of a different type than deposition methods used to form the first etch stopper layer and the second etch stopper layer.

16. The method as claimed in claim 15, wherein the forming of the third etch stopper layer is performed by a chemical vapor deposition (CVD) method.

17. The method as claimed in claim 11, wherein the forming of the active layer includes:
forming a material layer of the active layer; and
patterning the material layer of the active layer after forming the first etch stopper layer and the second etch stopper layer on the material layer of the active layer.

18. The method as claimed in claim 11, wherein the active layer is formed using an oxide semiconductor material.

19. The method as claimed in claim 11, wherein the first etch stopper layer and the second etch stopper layer are formed using an aluminum oxide, a titanium oxide, or a tantalum oxide or a gallium oxide.

20. The thin film transistor as claimed in claim 1, wherein:
the second etch stopper layer is between the first etch stopper layer and the third etch stopper layer, and
the first etch stopper layer is between the active layer and the second etch stopper layer.

* * * * *